United States Patent
Kaur et al.

(10) Patent No.: US 10,417,363 B1
(45) Date of Patent: Sep. 17, 2019

(54) POWER AND SCAN RESOURCE REDUCTION IN INTEGRATED CIRCUIT DESIGNS HAVING SHIFT REGISTERS

(71) Applicant: Cadence Design Systems, Inc., San Jose, CA (US)

(72) Inventors: Jagjot Kaur, Milpitas, CA (US); Priyanka Dasgupta, Bangalore (IN); Pratyush Aditya Kothamasu, Milpitas, CA (US); Vivek Chickermane, Slaterville Springs, NY (US)

(73) Assignee: CADENCE DESIGN SYSTEMS, INC., San Jose, CA (US)

( * ) Notice: Subject to any disclaimer, the term of this patent is extended or adjusted under 35 U.S.C. 154(b) by 86 days.

(21) Appl. No.: 15/391,594

(22) Filed: Dec. 27, 2016

(51) Int. Cl.
*G06F 17/50* (2006.01)
*G06F 11/27* (2006.01)

(52) U.S. Cl.
CPC ........ *G06F 17/505* (2013.01); *G06F 17/5045* (2013.01); *G06F 11/27* (2013.01); *G06F 2217/14* (2013.01)

(58) Field of Classification Search
CPC .. G06F 11/267; G06F 17/5045; G06F 17/505; G01R 31/318536; G01R 31/318586; G01R 31/318541; G01R 31/318533
See application file for complete search history.

(56) References Cited

U.S. PATENT DOCUMENTS

| | | | | |
|---|---|---|---|---|
| 5,132,974 A | * | 7/1992 | Rosales | G01R 31/31858 714/724 |
| 5,329,533 A | * | 7/1994 | Lin | G01R 31/31858 714/727 |
| 5,450,455 A | * | 9/1995 | Hamilton | G01R 31/31858 365/201 |
| 5,513,123 A | * | 4/1996 | Dey | G06F 11/2226 714/724 |
| 5,627,841 A | * | 5/1997 | Nakamura | G01R 31/31855 714/724 |
| 5,710,711 A | * | 1/1998 | Cheng | G01R 31/31858 714/726 |
| 5,717,700 A | * | 2/1998 | Crouch | G01R 31/31853 714/726 |
| 5,774,003 A | * | 6/1998 | Qureshi | H03K 3/037 327/202 |

(Continued)

OTHER PUBLICATIONS

Kwang-Ting Cheng; "Partial scan designs without using a separate scan clock"; Year: 1995; Proceedings 13th IEEE VLSI Test Symposium; pp. 277-282; Cited by: Papers (5) | Patents (8).*

(Continued)

*Primary Examiner* — Helen Rossoshek
(74) *Attorney, Agent, or Firm* — Foley & Lardner LLP

(57) ABSTRACT

Embodiments relate to methodologies for applying multibit cell merging to functional shift registers, thereby saving area, reducing scan-wirelength, saving power and reducing wiring congestion in integrated circuit designs. In embodiments, during synthesis, shift registers in a design are identified. In these and other embodiments, in identified shift registers, functional shift register flip-flops are merged into non-scan multi-bit flip-flops using a physically aware approach.

14 Claims, 5 Drawing Sheets

(56) References Cited

U.S. PATENT DOCUMENTS

| | | | |
|---|---|---|---|
| 6,389,566 B1 * | 5/2002 | Wagner | G01R 31/31854 327/202 |
| 6,539,536 B1 * | 3/2003 | Singh | G06F 17/5045 716/102 |
| 6,959,426 B2 * | 10/2005 | Xiang | G01B 31/31858 716/103 |
| 7,051,254 B2 * | 5/2006 | Sugimoto | G01R 31/31723 324/76.59 |
| 7,536,619 B2 * | 5/2009 | Satsukawa | G11C 29/38 714/732 |
| 7,693,676 B1 | 4/2010 | Keller et al. | |
| 8,020,131 B1 | 9/2011 | Van Mau et al. | |
| 8,281,279 B2 | 10/2012 | Maloney et al. | |
| 8,438,436 B1 * | 5/2013 | Baker | G01R 31/31858 714/34 |
| 8,468,404 B1 | 6/2013 | Chickermane et al. | |
| 8,584,074 B1 | 11/2013 | Thirunavukarasu et al. | |
| 8,738,978 B2 * | 5/2014 | Tekumalla | G01R 31/31853 714/726 |
| 8,904,256 B1 | 12/2014 | Chakravadhanula et al. | |
| 9,423,455 B2 * | 8/2016 | Oomman | G01R 31/31704 |
| 9,470,754 B1 | 10/2016 | Chickermane et al. | |
| 9,470,755 B1 | 10/2016 | Foutz et al. | |
| 9,470,756 B1 | 10/2016 | Wilcox et al. | |
| 9,501,590 B1 | 11/2016 | Cunningham et al. | |
| 2003/0226077 A1 * | 12/2003 | Zyuban | G01R 31/31721 714/726 |
| 2006/0282727 A1 * | 12/2006 | Hoshaku | G01R 31/31857 714/726 |
| 2007/0245285 A1 | 10/2007 | Wang et al. | |
| 2008/0071513 A1 | 3/2008 | Chickermane et al. | |
| 2009/0119559 A1 | 5/2009 | Foutz et al. | |
| 2009/0326854 A1 | 12/2009 | Chakravadhanula et al. | |
| 2014/0270050 A1 * | 9/2014 | Wang | G06F 17/5045 377/67 |

OTHER PUBLICATIONS

S. J. Faris; "Circuit design for full scan ATPG"; Year: 1991; [1991] Proceedings Fourth Annual IEEE International ASIC Conference and Exhibit; pp. P6-61/1-4; Cited by: Papers (2) | Patents (1).*

Kretchmer, Y., "Using Multibit Register Inference to Save Area and Power "The good, the bad, and the ugly"", SNUG'99, 13 pages.

Mutschler, Anna Stefffora, "Another Tool in the Bag", Seminengineering.com, Nov. 6, 2014, 5 pgs.

* cited by examiner

POWER AND SCAN RESOURCE REDUCTION IN INTEGRATED CIRCUIT DESIGNS HAVING SHIFT REGISTERS

TECHNICAL FIELD

Embodiments relate generally to obtaining improved integrated circuit designs and more specifically to reducing power consumption and resources required to implement scan functionality in an integrated circuit.

BACKGROUND

During synthesis of a design of an application specific integrated circuit (ASIC) or system-on-chip (SOC), multibit mapping or multibit cell merging of flip-flops can be performed. Example aspects of conventional multibit techniques are described, for example, in by A. Mutschler, "Another Tool In the Bag"—http://semiengineering.com/another-tool-in-the-bag/; and Y. Kretchmer, "Using Multibit register inference to save area and power" http://www.eetasia.com/ART_8800107513_480100_AN_c6844605.HTM.

However, such conventional techniques are not applied to flip-flops in shift registers, which can negatively impact the amount of resources consumed in designs having large numbers of functional shift registers, among other things.

SUMMARY

Embodiments relate to methodologies for applying multibit cell merging to functional shift registers, thereby saving area, reducing scan-wirelength, saving power and reducing wiring congestion in integrated circuit designs. In embodiments, during synthesis, shift registers in a design are identified In these and other embodiments, in identified shift registers, functional shift register flip-flops are merged into non-scan multi-bit flip-flops using a physically aware approach.

BRIEF DESCRIPTION OF THE DRAWINGS

These and other aspects and features of the present embodiments will become apparent to those ordinarily skilled in the art upon review of the following description of specific embodiments in conjunction with the accompanying figures, wherein.

DETAILED DESCRIPTION OF THE PREFERRED EMBODIMENTS

The present embodiments will now be described in detail with reference to the drawings, which are provided as illustrative examples of the embodiments so as to enable those skilled in the art to practice the embodiments and alternatives apparent to those skilled in the art. Notably, the figures and examples below are not meant to limit the scope of the present embodiments to a single embodiment, but other embodiments are possible by way of interchange of some or all of the described or illustrated elements. Moreover, where certain elements of the present embodiments can be partially or fully implemented using known components, only those portions of such known components that are necessary for an understanding of the present embodiments will be described, and detailed descriptions of other portions of such known components will be omitted so as not to obscure the present embodiments. Embodiments described as being implemented in software should not be limited thereto, but can include embodiments implemented in hardware, or combinations of software and hardware, and vice-versa, as will be apparent to those skilled in the art, unless otherwise specified herein. In the present specification, an embodiment showing a singular component should not be considered limiting; rather, the present disclosure is intended to encompass other embodiments including a plurality of the same component, and vice-versa, unless explicitly stated otherwise herein. Moreover, applicants do not intend for any term in the specification or claims to be ascribed an uncommon or special meaning unless explicitly set forth as such. Further, the present embodiments encompass present and future known equivalents to the known components referred to herein by way of illustration.

According to certain aspects, the present embodiments provide methodologies for applying multibit cell merging to functional shift registers, thereby saving area, reducing scan-wirelength, saving power and reducing wiring congestion in integrated circuit designs.

As is known, during the design of an application specific integrated circuit (ASIC) or system-on-chip (SOC), design for test (DFT) and automatic test pattern generation (ATPG) methodologies are typically used to develop a test sequence that, when applied to the ASIC or SOC, can detect potential failures of the ASIC or SOC. After the ASIC or SOC has been manufactured, it can be placed into scan mode, which forces all the flip-flops in the device to be connected in a simplified fashion, and these test sequences can be used to test all the flip-flops, as well as to trace failures to specific flip-flops.

Figure 1A:
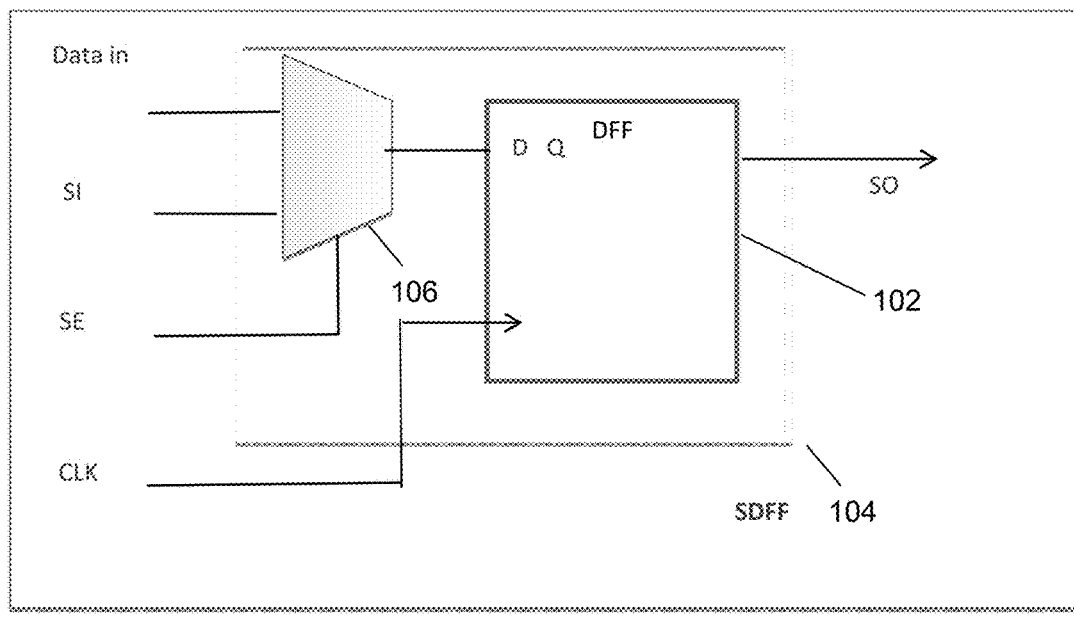
FIGS. 1A and 1B are block diagrams illustrating example techniques for converting flip-flops in a design for use in a scan chain.
Figure 1B:
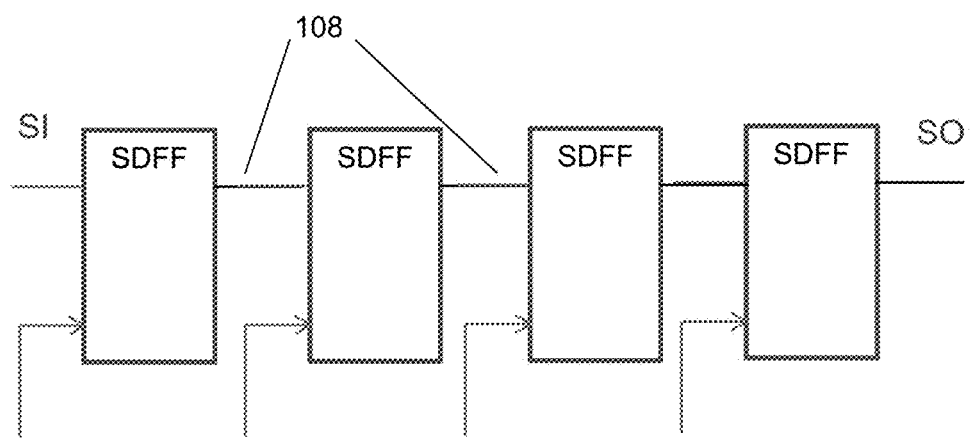

FIGS. 1A and 1B are block diagrams illustrating aspects of conventional DFT methodologies for implementing scan chains in a design. As shown in FIG. 1A, during synthesis, a scannable D-flip flop (DFF) 102 is identified. For example, in some embodiments, a scannable DFF is a flip-flop whose clock pin is fully controllable from a primary input (PI) of the design under test. Further, any asynchronous preset or clear pin of the flip-flop can be either disabled during test or fully controllable from a PI. For use in a scan chain, the flip flop 102 having an input clock signal (CLK) and output is converted to a scan flip flop (SDFF) 104 by adding a multiplexer 106 between its data input "Data in" pin and adding connections between the multiplexer 106 and scan input signals SI and SE, as well as adding a connection between the output pin of DFF 102 to the scan output SO. It should be noted that a DFF can include other pins not shown in FIG. 1A. However, further details thereof are omitted here for sake of clarity of the embodiments.

As further shown in FIG. 1B, a scan chain in a design is formed by adding connections 108 between the SI and SO signals of all the scannable flip flops in the design that have been converted to scan flip flops. As is known, during scan, the SE signal is enabled to all the scan flip flops, causing them to input and clock scan data (e.g. associated with ATPG test vectors) through the scan signals SI and SO rather than their normal functional non-scan inputs Data in via multiplexer 106.

Multibit mapping refers to a technique used in a synthesis flow to map individual RTL register bits onto multibit technology cell instances. This differs from the default approach which maps each individual bit of a bus to its own register instance. Multibit mapping reduces power (e.g. clock-tree power), and alleviates wiring congestion in the clock path. A single clock pin is used to trigger all register bits in the multibit cell which eases clock-tree synthesis since the number of clock nets to be routed is reduced. Furthermore, the number of register endpoints to be considered when balancing the clock-tree is reduced. Otherwise, the multibit cell is operationally equivalent to the individual cells it replaces.

Figure 2:
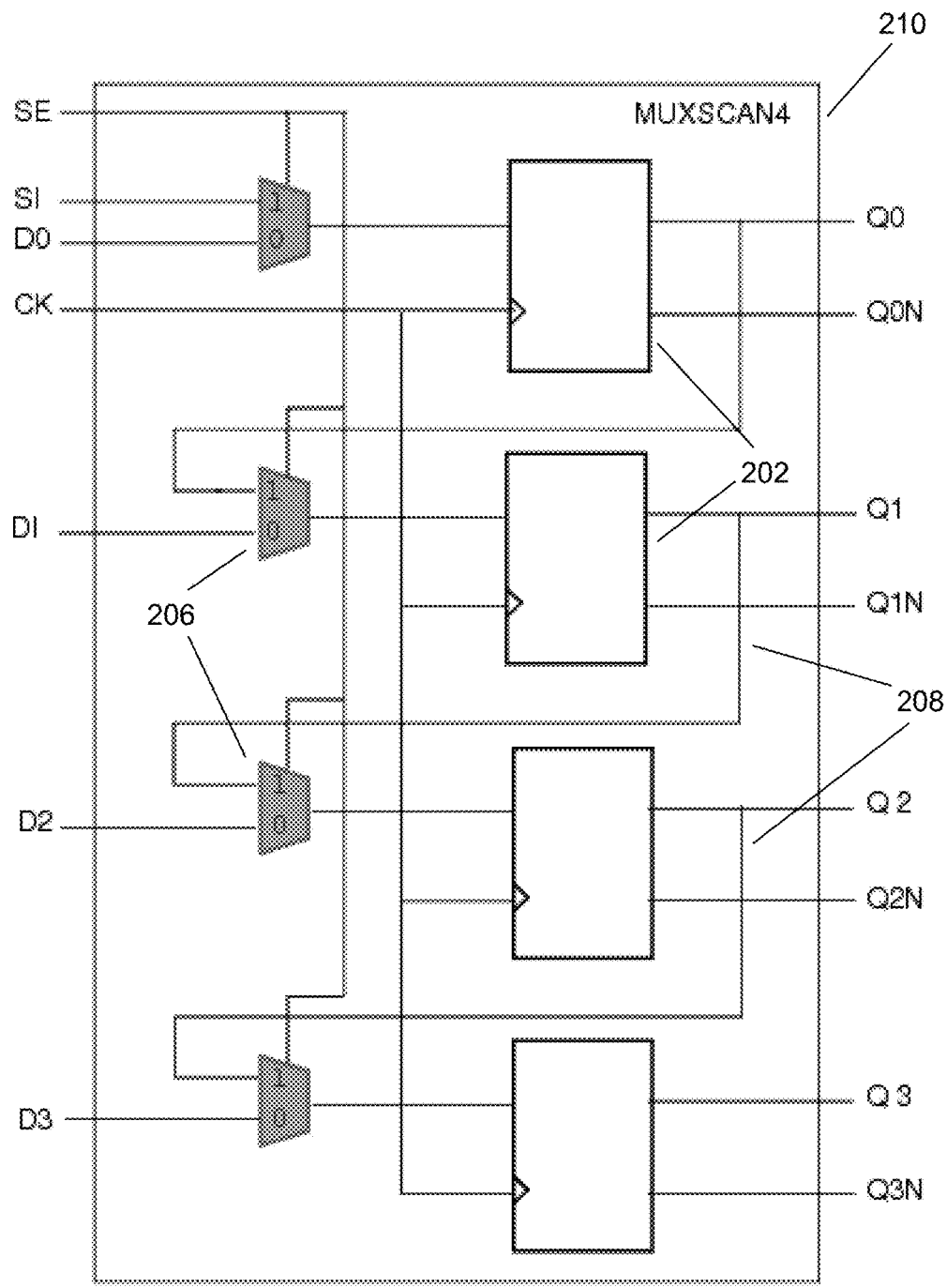
FIG. 2 illustrates an example technique for performing multibit mapping of scan flops that have been converted as described in connection with FIGS. 1A and 1B.

An example of multibit mapping is shown in FIG. 2. In this example, four single-bit DFF's 202 have been converted to a multibit SDFF by incorporating the multiplexers 206 and scan chain connections 208 as described in more detail above in connection with FIG. 1. As shown, these four DFF's 202 have been further incorporated into a 4-bit register 210 having a single common clock input. By construction of register 210, during normal non-scan operation, each DFF 202 can operate to clock respective data D0, D1, D2, D3 to individual outputs Q0/Q0N, Q1/Q1N, Q2/Q2N, Q3/Q3N via the common clock input. During scan operation, the scan input SI is clocked through the scan chain formed by connections 208 and output on Q3 via the common clock input (i.e. Q3 effectively serves as a scan out pin for this multibit cell).

As set forth above, an increasing number of large designs, and especially networking and switch designs, include large numbers of functional shift registers. For some designs, more than 60% of the design's flip-flops may be included in functional shift registers (SRs). One approach for forming scan chains that can be followed in designs with large numbers of shift registers is called shift register identification. In its ordinary functional form, a shift register can be viewed as a shiftable scan chain. By identifying shift registers before mapping, the DFT engine can use the functional path of the shift register as the scan path by only replacing the first DFF in the shift register with a SDFF, while maintaining the existing connectivity of the remaining DFFs. This helps reduce the scan-wire length in physical aware synthesis and it also helps reduce the area by avoiding the conversion of all the DFFs into SDFFs (i.e., by adding multiplexers for each of the DFFs into the design).

Figure 3:
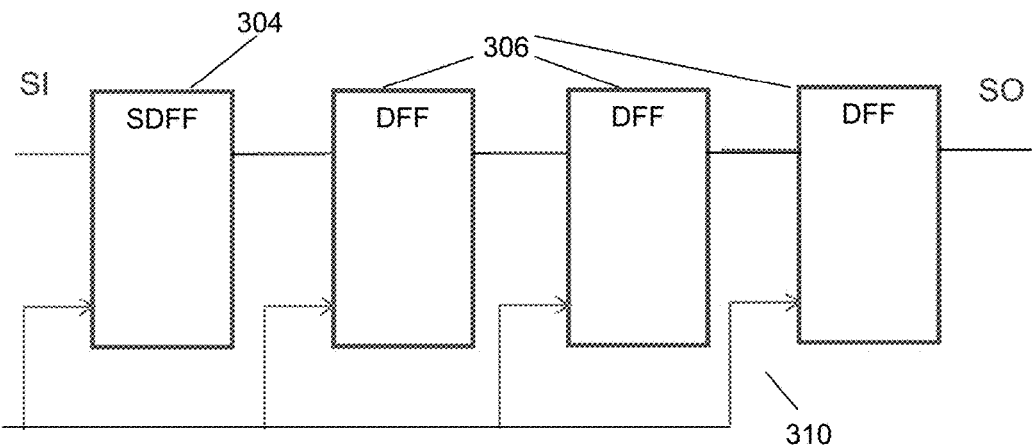
FIG. 3 is a block diagram illustrating an example shift register that has been converted for use in a scan chain according to embodiments.

An example of this approach is shown in FIG. 3. In this example, a four-bit shift register 310 has been identified for use in a scan chain during synthesis, for example by using shift register identification techniques that will be described in more detail below. As shown, four-bit shift register 310 has been converted to use in the scan chain by converting the first one of the existing DFFs 306 in the register 310 to a SDFF 304 and adding external connections from the input and output pins of SDFF 304 to signals SI and SO of the scan chain.

Although this approach has many benefits such as area reduction and reduction in scan-wire length as set forth above, the present applicants have recognized that to date, multibit mapping as described above has been limited to normal scannable design flip-flops. Meanwhile, any flip-flops that are identified as being a part of shift registers are not considered candidates for multibit cell merging in conventional DFT approaches. The present applicants have further recognized that, as a result, impacts on power consumption can be substantial. For example, in networking and other designs, a large percentage of flops belonging to shift registers do not get merged to multi-bit cells, thereby failing to take advantage of the additional clock-tree power reduction and area reduction benefits of multibit mapping.

According to certain aspects, therefore, further embodiments of the present disclosure are directed to reusing functional shift register flops for merging to non-scan multibit flops during synthesis and at the same time maintaining scan-chain traceability and connectivity. Embodiments therefore employ a physically aware approach to reuse the shift register flip-flops for merging into non-scan multibit cells.

More particularly, a multibit merging scheme according to embodiments allows the flip-flops from a single shift register to be merged into a serial multibit configuration and flip-flops from different shift registers to be merged into a parallel multibit configuration, for example based on the physical proximity of the shift registers to each other.

Figure 4:
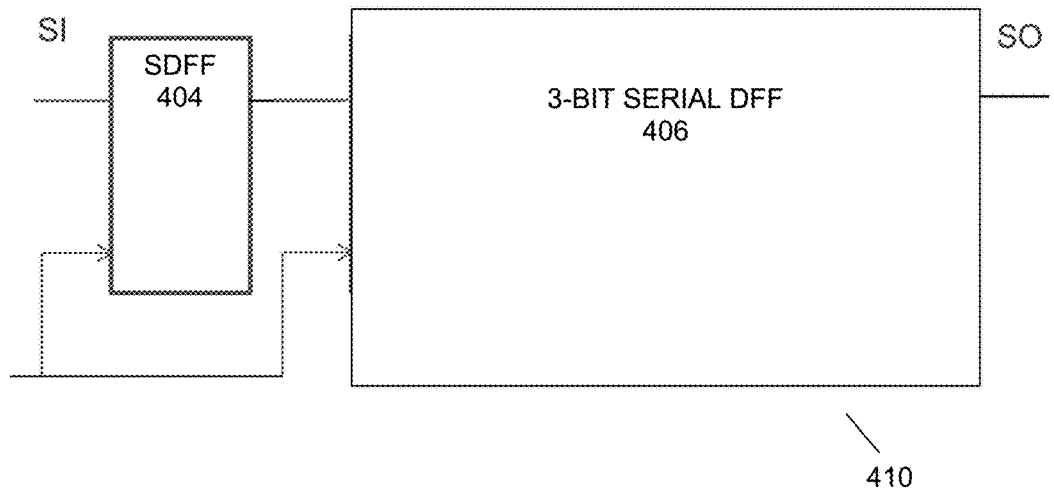
FIG. 4 is a block diagram illustrating an example shift register that has been converted to include a serial multibit cell according to embodiments.

For example, as shown in FIG. 4, the single four-bit shift register 310 in FIG. 3 is converted into shift register 410 having a serial multibit configuration according to the present embodiments. More particularly, the three non-scan flip-flops 306 of shift register 310 have been replaced with a single three-bit serial DFF 406 in shift register 410. Among other things, this reduces clock tree power for the design by virtue of the fact that the separate clock inputs for the DFFs 306 are replaced by a single clock input to the three-bit serial DFF 406. Those skilled in the art will be able to implement a serial DFF such as the three-bit serial DFF 406, as well as serial DFFs having other numbers of bits using known techniques, and so further details thereof will be omitted for sake of clarity of the invention.

Figure 5:
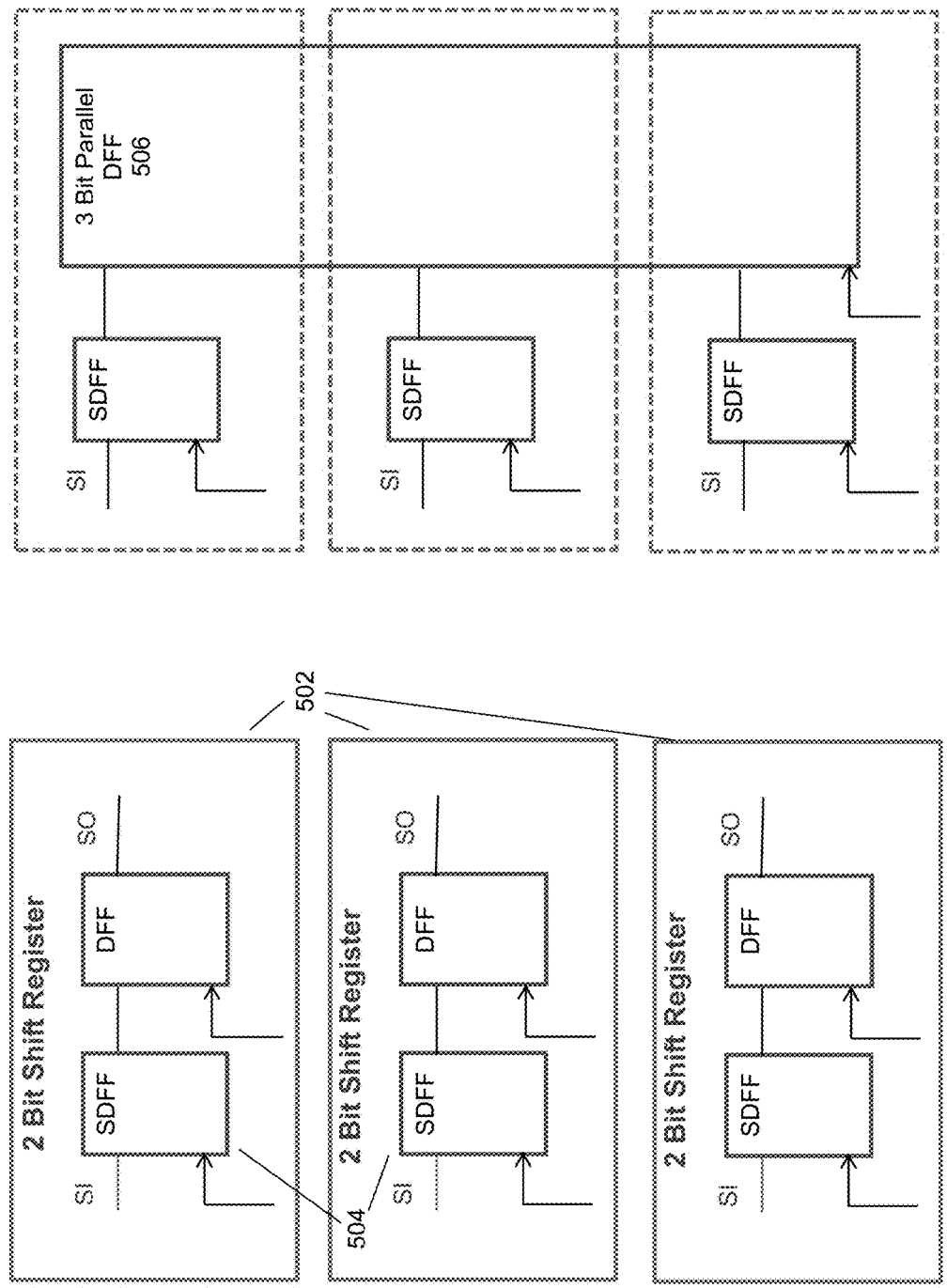
FIGS. 5A and 5B are block diagrams illustrating example shift registers that have been converted to include a parallel multibit cell according to embodiments.

FIGS. 5A and 5B illustrate an example of merging shift registers into a parallel multibit configuration according to the present embodiments. As shown in FIG. 5A, an original design includes three two-bit shift registers 502, which each have already been converted for use in a scan chain by including an SDFF 504 for the first bit. In this example, as shown in FIG. 5B, the three individual DFFs in the shift registers 502 are merged into a single three-bit parallel DFF 506. Among other things, this reduces clock tree power for the design by virtue of the fact that the separate clock inputs for the DFFs in two-bit shift register 502 are replaced by a single clock input to the three-bit parallel DFF 506. Those skilled in the art will be able to implement a parallel DFF such as the three-bit parallel DFF 506, as well as parallel DFFs having other numbers of bits using known techniques, and so further details thereof will be omitted for sake of clarity of the invention.

Figure 6:
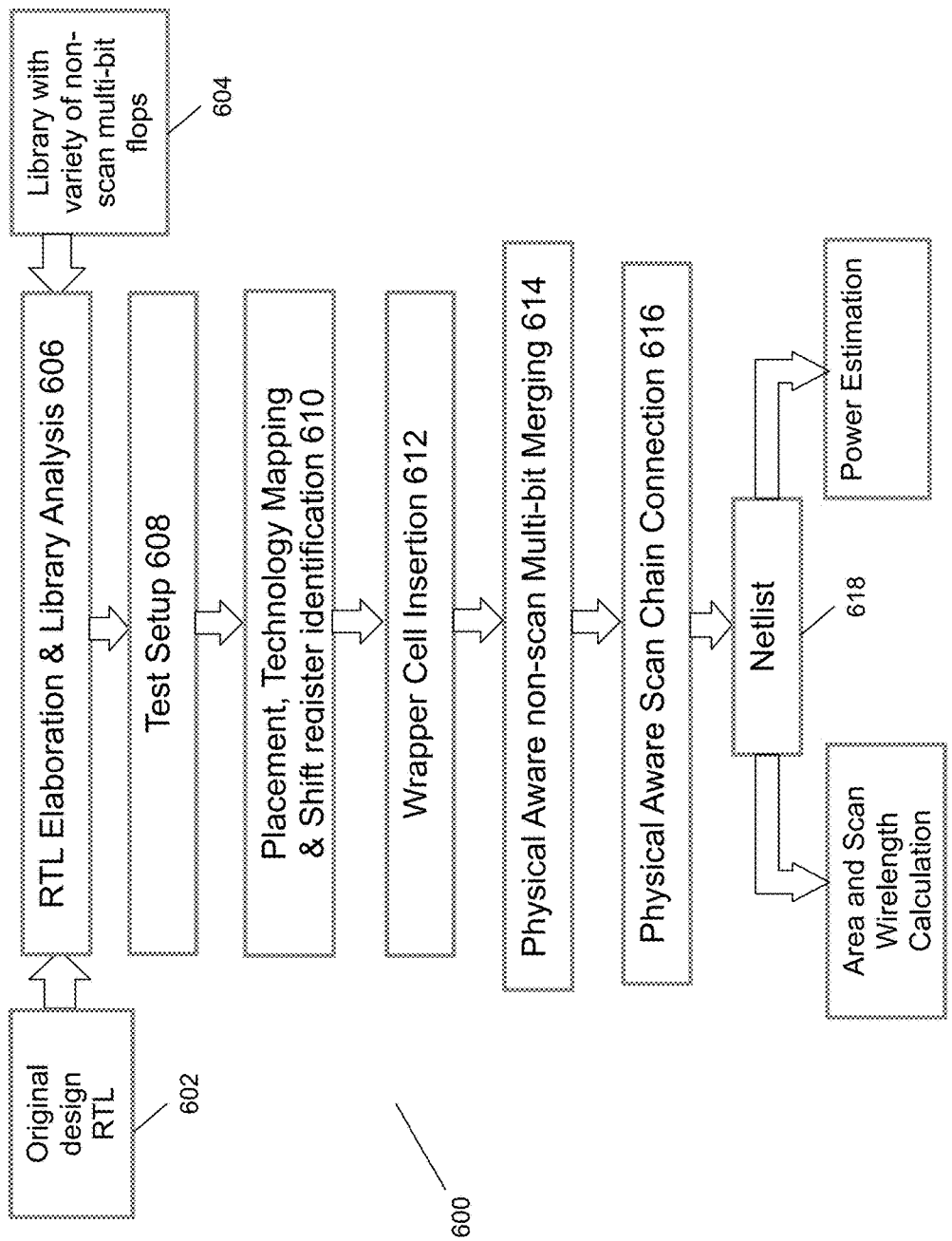
FIG. 6 is a diagram illustrating an example of how an integrated circuit design flow can be adapted to incorporate the shift register identification and shift register multibit merging techniques of the present embodiments into a design.

FIG. 6 depicts an example synthesis flow 600 for synthesizing a design of an ASIC or SOC that includes the shift register identification and shift register multibit merging techniques of the present embodiments.

Synthesis flow 600 can be implemented by adapting a RTL synthesis and physical synthesis design tool with functionality for incorporating the shift register identification and shift register multibit merging techniques of the present embodiments. Those skilled in the art of such design tools will understand how to adapt them so as to support the techniques of the present embodiments after being taught by the present examples.

The synthesis flow 600 as adapted as described herein can be included in a system also comprising one or more EDA modules for assisting a user to interactively implement integrated circuit designs, the EDA modules including one or more of a placer, a routing engine, a design rule checker, a floorplanner, a layout editor, a power integrity signoff engine, an implementation engine, an optimization engine and/or a timing analysis and signoff engine, etc. as will be appreciated by those skilled in the art. In other embodiments, synthesis flow 600 can be implemented a standalone application that only includes one or some of these modules and/or is adapted to communicate with other EDA modules.

In embodiments, a system incorporating a synthesis flow 600 according to the embodiments can be implemented by one or more general purpose computers that are loaded with an operating system executing software and/or customized to include hardware for interactively implementing physical electronic designs (e.g. designs such as original design RTL 602 stored in a GDS II data format) and adapted with the protection functionality of the present disclosure. In some embodiments, the one or more computing systems comprise various components not shown such as the processor(s) or processor core(s), memory, disks, etc. The one or more computing systems may further write to and read from a local or remote volatile or non-volatile computer accessible storage not shown that stores thereon data or information such as, but not limited to, one or more databases such as schematic design database(s) or physical design database(s), libraries, data, rule decks, constraints, etc. and/or other information or data that may be required to support the methodology of the present embodiments. In some embodiments, the one or more computing systems are implemented in a "cloud" configuration and/or a client/server configuration. For example, one or more server computers may be loaded with application software (e.g., a synthesis tool and test tool) for implementing some or all of the methodology of the present embodiments, and one or more client computers can communicate with the server computer(s) via a network to perform some or all of the methodology of the embodiments for a particular design.

Returning to the example shown in FIG. 6, synthesis flow 600 according to embodiments includes library 604, which contains predefined cells comprising a variety of non-scan serial and parallel multibit flops, such as those described above in connection with FIGS. 4 and 5, and having different numbers of bits. Moreover, there may be a variety of types of flops, such as variations in the presence or absence of input pins such as preset and clear signals, internal clock enables, and both non-inverted (Q) and inverted (Qbar) functional outputs.

The original design RTL 602 and library 604 are provided to block 606 where RTL elaboration and library analysis is performed. In this step, the register-transfer level of the design is transformed into the internal representation of the logic synthesis tool using a data flow graph to show how the design processes and transports data between functional units and a control flow graph that depicts the timing and synchronization of the data flow. In block 608, the technology library that contains the building blocks of the logic cells (AND, OR, XOR etc) and specifications of timing of signal transitions from input to output pins, power consumed, area and other electrical characteristics are analyzed. This is used to map logic gates into technology cells, which is called technology mapping, block 610. The selection of appropriate technology cells is made on the basis of multiple cost functions like required arrival time, area and power. To make the appropriate decisions these instances are placed on various locations on the die as per connectivity and timing needs. As part of technology mapping, shift registers are identified.

In embodiments, there are two steps involved in shift register identification. In a first step, local shifts are identified. In this step, the process finds flip-flop pairs that shift data between them, and which are driven by the same edge of test clock. More particularly, pseudocode for performing this step in example embodiments is set forth in TABLE 1:

TABLE 1 procedure local_shift(design)
begin
  1. Sort all instances in the design on their names
  2. For each instance I, do the following:
    begin
      if (I is a hierarchical instance) then
        local_shift(design of I)
      else
        a. Get the D pin of flop I
        b. Try to trace back from the D pin to another flip-flop J.
        c. If flops I and J are triggered by the same edge of the same clock, then put forward tag from J to I and backward tag from I to J. Add I and J to a list L.
      endif
    end for
end procedure In a second step, global shifts are identified. In this step, the process finds the longest shift registers from the above shift-pairs. Cycles are removed during the traversal and ties in path distance between two next nodes are resolved in a deterministic manner. More particularly, pseudocode for performing this step in example embodiments is set forth as follows in TABLE 2:

TABLE 2 procedure global_shift(design)
begin
  1. For each flip-flop F in L, do the following:
    begin
      if (there is no backward tage from F) then
        Add F to the list L2 of first flops
      Else if (there are multiple tags from F) then
        begin
          a. For every fan-out path from F, calculate the path length by doing a DFS traversal of the forward tags.
          b. If a cycle is detected during the DFS, the edge that leads to the cycle is removed.
          c. Retain the tags of the next flop that leads to the longest path. Remove all other tags between F and other fan-outs.
          c. Add the flop whose backward tag to F has been removed to L2.
      endif
    end for
  2. For every flop FF in L2, traverse along the forward tags to get a shift register.
end procedure It should be noted that block 610 or other blocks can further include conventional functionality for identifying scannable flops as described above.

After technology mapping and shift register identification is performed, block 612 includes processing for performing wrapper cell insertion. In this block, IEEE1500 wrapper cells are inserted on the design's input and output ports. It should be noted that this block is depicted to just show the point where wrapper cell insertion should be performed in the synthesis flow 600.

In block 614, multibit cell merging is performed which includes causing the identified shift register flip-flops to be merged into multi-bit flops in a serial or parallel fashion. In embodiments, physical proximity of flops among or across shift registers decides what type of merging occurs. In the example shown in FIG. 3, flops 306 in the same shift register were placed close to each other, which meant serial merging was prudent in the case, as shown in FIG. 4. In the example shown in FIG. 5A, flops 502 across separate shift registers were placed in close proximity, which in turn resulted in parallel merging, i.e., merging of flops across shift registers in single non-scan multibit flop, as shown in FIG. 5B.

It should be noted that, since an N-bit non-scan multibit cell consumes a lesser amount of area and power as compared to the N single bit cells, performing block 614 according to embodiments contributes to the overall area and power savings.

In block 616, after merging of the shift register flip-flops into non-scan multibit cells, the design undergoes physical aware scan-chain connection to get the final netlist 618. This block can include identifying and converting appropriate flip-flops into scannable flip-flops (i.e. SDFFs) as described above. Physical aware scan-chain connection includes scan-chain reorder which re-arranges the scan-chain flip-flops according to their physical proximity to each other while maintaining the existing scan-chain connectivity and integrity.

As shown in FIG. 6, flow 600 can further include blocks for performing area and scan wirelength calculation, as well as power estimation. The results of these blocks can be used to determine whether the synthesized design is acceptable, or if further changes to the design should be made.

The present applicants have analyzed three networking designs targeting 16 nm technology and having flip-flops in the range from 150-300K and 35-60% of the flip-flops belonging to shift registers. Using techniques described herein, a sequential cell area saving of around 4-6% was achieved, along with a scan wire-length saving of 46-67% and a combined clock-tree and sequential power reduction of 7-28%.

Although the present embodiments have been particularly described with reference to preferred ones thereof, it should be readily apparent to those of ordinary skill in the art that changes and modifications in the form and details may be made without departing from the spirit and scope of the present disclosure. It is intended that the appended claims encompass such changes and modifications.

What is claimed is:

1. An integrated circuit comprising:
a multibit non-scan flip-flop;
a shift register comprising a plurality of bit cells, the plurality of bit cells including:
   a first bit cell implemented by a scan flip-flop, and
   at least one bit cell implemented by the multibit non-scan flip-flop,
wherein the shift register is functional to perform shift register operations using the plurality of bit cells during a non-scan mode of operation of the integrated circuit; and
a second shift register comprising a second plurality of bit cells, the second plurality of bit cells including:
   a second bit cell implemented by a scan flip-flop, and
   at least one second bit cell implemented by the multibit non-scan flip-flop,
wherein the multibit non-scan flip-flop is equivalent to two or more flip-flops in parallel, and
wherein the at least one bit cell and the at least one second bit cell are implemented by the multibit non-scan flip-flop, and
wherein the multibit non-scan flip-flop includes one and only one clock pin.

2. The integrated circuit of claim 1, wherein the multibit non-scan flip-flop includes an input pin and an output pin that are connected to a scan chain.

3. The integrated circuit of claim 1, wherein the multibit non-scan flip-flop is equivalent to two or more non-scannable D flip-flops (DFFs).

4. The integrated circuit of claim 1, wherein the first bit cell corresponds to an input bit cell of the shift register.

5. The integrated circuit of claim 1, wherein the scan flip-flop comprises a multiplexer that is configured to cause the scan flip-flop to accept either a normal data input or a scan input in response to a scan enable input.

6. The integrated circuit of claim 1, wherein the multibit non-scan flip-flop consists essentially of a single clock input for serially clocking a plurality of bits through the multibit non-scan flip-flop.

7. A method of implementing a design of an integrated circuit, comprising:
identifying, by a processor of a design tool, a shift register in the design, the shift register including a plurality of flip-flops;
merging, by the processor of the design tool, at least one of the plurality of flip-flops of the identified shift register into a multibit non-scan flip-flop; and
synthesizing, by the processor of the design tool, the design including the multibit non-scan flip-flop for use in physically implementing the integrated circuit,
wherein the shift register is functional to perform shift register operations using the plurality of flip-flops during a non-scan mode of operation of the integrated circuit, and
wherein identifying includes local shifts identification followed by global shifts identification based on results of the local shifts identification, and
wherein local shifts identification includes generating a list of candidate pairs of flip-flops in the design that shift data between them and are driven by the same edge of a clock,
wherein global shifts identification includes merging together candidate pairs of flip-flops in the design, and
wherein the multibit non-scan flip-flop includes one and only one clock pin.

8. The method of claim 7, wherein global shifts identification includes finding the longest shift registers among the list of pairs of flip-flops.

9. The method of claim 8, wherein global shifts identification further includes finding a first flip-flop for each of the longest shift registers.

10. The method of claim 9, further comprising converting the first flip-flop for each of the longest shift registers into a scan flip-flop.

11. The method of claim 7, wherein the multibit non-scan flip-flop includes an input pin and an output pin, the method further comprising connecting the input pin and the output pin to a scan chain.

12. The method of claim 7, wherein the multibit non-scan flip flop is equivalent to a serial chain of two or more flip-flops, and wherein merging includes merging all of the plurality of flip-flops other than a first one of the plurality of flip-flops into one multibit non-scan flip-flop.

13. The method of claim 7, wherein the multibit non-scan flip-flop is equivalent to two or more flip-flops in parallel, and wherein merging further includes merging bit cells from more than one shift register into the multibit non-scan flip-flop.

14. The method of claim 7, wherein merging includes configuring the multibit non-scan flip-flop to consist essentially of a single clock input for serially clocking a plurality of bits through the multibit non-scan flip-flop.

\* \* \* \* \*